(12) United States Patent
Ramaraju et al.

(10) Patent No.: US 8,489,906 B2
(45) Date of Patent: Jul. 16, 2013

(54) DATA PROCESSOR HAVING MULTIPLE LOW POWER MODES

(75) Inventors: Ravindraraj Ramaraju, Round Rock, TX (US); David R. Bearden, Austin, TX (US); Troy L. Cooper, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 422 days.

(21) Appl. No.: 12/786,916

(22) Filed: May 25, 2010

(65) Prior Publication Data

US 2011/0296211 A1 Dec. 1, 2011

(51) Int. Cl.
*G06F 1/32* (2006.01)

(52) U.S. Cl.
USPC ........ 713/323; 713/321; 365/185.16; 365/227

(58) Field of Classification Search
USPC ...................... 713/321, 323; 365/185.16, 227
See application file for complete search history.

(56) References Cited

U.S. PATENT DOCUMENTS

| 6,021,500 | A | 2/2000 | Wang et al. |
|---|---|---|---|
| 6,785,829 | B1 | 8/2004 | George et al. |
| 7,042,274 | B2 | 5/2006 | Hazucha et al. |
| 7,080,269 | B2 | 7/2006 | Baumgartner et al. |
| 7,085,943 | B2 | 8/2006 | Chun et al. |
| 7,155,621 | B2 | 12/2006 | Dai |
| 7,260,731 | B1 | 8/2007 | Read et al. |
| 7,262,631 | B2 | 8/2007 | Chong |
| 7,379,374 | B2 * | 5/2008 | Tran ......................... 365/230.03 |
| 7,385,435 | B2 | 6/2008 | Pham et al. |
| 7,397,721 | B2 * | 7/2008 | Lee ................................ 365/227 |
| 7,460,429 | B2 | 12/2008 | Schoenfeld |
| 7,539,878 | B2 | 5/2009 | Vaglica |
| 7,657,767 | B2 * | 2/2010 | Rusu et al. .................... 713/323 |
| 2007/0147159 | A1 | 6/2007 | Lee |
| 2008/0088358 | A1 | 4/2008 | Caplan et al. |
| 2009/0203410 | A1 | 8/2009 | Lu |
| 2009/0285046 | A1 | 11/2009 | Ehrenreich et al. |
| 2010/0123515 | A1 | 5/2010 | Sasaki et al. |

OTHER PUBLICATIONS

Takashima, D., et al., Standby/Active Mode Logic for Sub-1-V Operating ULSI Memory, IEEE Journal of Solid-State Circuits, vol. 29, No. 4, Apr. 1994.
International Application No. PCT/US2011/033211, Search Report and Written Opinion dated Dec. 19, 2011.

* cited by examiner

*Primary Examiner* — Thuan Du
(74) *Attorney, Agent, or Firm* — Daniel D. Hill; Joanna G. Chiu (57) ABSTRACT

A processor includes a first virtual terminal, a second virtual terminal, circuitry coupled to the first virtual terminal for providing current to the first virtual terminal, a first regulating transistor coupled between the first virtual terminal and the second virtual terminal, a first disabling transistor coupled in parallel with the first regulating transistor for selectively disabling the first regulating transistor by directly connecting the second virtual terminal to the first virtual terminal, a second regulating transistor coupled between the second virtual terminal and a first power supply voltage terminal, and a second disabling transistor coupled in parallel with the second regulating transistor for selectively disabling the second regulating transistor by directly connecting the second virtual terminal to the first power supply voltage terminal.

20 Claims, 4 Drawing Sheets

| MODE | REGULATOR 22 | REGULATOR 24 | REGULATOR 20 |
|---|---|---|---|
| NORMAL | OFF | OFF | OFF |
| | OFF | OFF | ON |
| | OFF | ON | OFF |
| MEMORY RETENTION LOW POWER MODES | OFF | ON | ON |
| | ON | OFF | ON |
| | ON | OFF | OFF |
| | ON | ON | ON |
| MEMORY NON-RETENTION LOW POWER MODES | ON | ON | OFF |

FIG. 4

DATA PROCESSOR HAVING MULTIPLE LOW POWER MODES

BACKGROUND

1. Field

This disclosure relates generally to data processing systems, and more specifically, to a data processor having multiple low power modes.

2. Related Art

Static leakage power has become a significant portion of the power consumption of very large scale system-on-a-chip (SoC) integrated circuits. Reducing leakage current is becoming an increasingly important factor in extending battery life of, for example, handheld devices.

Most circuits in handheld devices are typically off, for example, in an idle or deep sleep mode, for a significant portion of time, consuming only leakage power. As transistor leakage currents increase with finer geometry manufacturing processes, it becomes more difficult to meet chip leakage targets using traditional power reduction techniques.

There are several methods for reducing leakage currents of integrated circuits during a low power mode. One method involves providing a "virtual" ground terminal that can be at ground potential during a normal operating mode and then increased above ground during a low power operating mode to reduce the leakage current. However, a minimum data retention voltage must be maintained when reducing the power supply voltage to cache memories of the system to avoid corruption of stored data.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a data processor having one or more functional logic blocks and one or more levels of cache memory. In one embodiment, a combinational logic block and a cache memory are coupled to a power supply voltage terminal. The power supply terminal may be selectively coupled to ground, to a first predetermined voltage above ground, or to a second predetermined voltage above ground. The first and second predetermined voltages are provided using voltage regulators that can be enabled and disabled depending on the operating mode and whether or not stored data must be preserved. In one embodiment, a global voltage regulator is coupled between a first virtual ground terminal and ground and is used to set the first predetermined voltage above ground. A first local voltage regulator is coupled between a functional logic block and the first virtual ground terminal. A second local voltage regulator is coupled between a cache memory and the first virtual ground terminal. During a first low power mode, and if the stored data of the cache memory is to be maintained, either the second local voltage regulator is enabled or the global voltage regulator is enabled to provide the first predetermined voltage above ground to the cache memory. During a second low power mode, and if the stored data is not to be retained, the global voltage regulator and the second local voltage regulator are turned on at the same time to provide the second predetermined voltage above ground to the cache memory.

In one aspect, there is provided, a processor comprising: a first virtual ground terminal; a second virtual ground terminal; circuitry coupled to the first virtual ground terminal for providing current to the first virtual ground terminal; a first regulating transistor coupled between the first virtual ground terminal and the second virtual ground terminal; a first disabling transistor coupled in parallel with the first regulating transistor for selectively disabling the first regulating transistor by directly connecting the second virtual ground terminal to the first virtual ground terminal; a second regulating transistor coupled between the second virtual ground terminal and a first ground terminal; and a second disabling transistor coupled in parallel with the second regulating transistor for selectively disabling the second regulating transistor by directly connecting the second virtual ground terminal to the ground terminal. The processor may further comprise: a first bias circuit coupled between a power supply voltage terminal and the second virtual ground terminal and having an input coupled to the first virtual ground terminal and having an output coupled to a control electrode of the first regulating transistor; and a second bias circuit coupled between the power supply voltage terminal and the ground terminal and having an input coupled to the second virtual ground terminal and having an output coupled to a control electrode of the second regulating transistor. The current provided by the circuitry to the first node may be a leakage current which occurs during a lower power mode. The circuitry may be coupled to a power supply voltage terminal, wherein a voltage at the first virtual ground terminal is less than a voltage at the power supply voltage terminal and greater than ground. A voltage at the first virtual ground terminal may be less than a voltage at the power supply voltage terminal and greater than the voltage at the second virtual ground terminal. The circuitry may comprise a memory, and wherein only one of the first regulating transistor and the second regulating transistor is enabled during a lower power mode such that loss of state in the memory is prevented. The circuitry may comprise a functional block which performs a processor operation, and wherein one or more of the first regulating transistor and the second regulating transistor is enabled during a low power mode. Upon exiting the low power mode, the second regulating transistor may be disabled prior to disabling the first regulating transistor.

In another embodiment, there is provided, a processor comprising: a first virtual terminal; a second virtual terminal; a first power supply terminal; a second power supply terminal; circuitry coupled between the second power supply terminal and the first virtual terminal; a first voltage regulator coupled between the first virtual terminal and the second virtual terminal; a second voltage regulator coupled between the second virtual terminal and the first power supply terminal, wherein: when the first voltage regulator is enabled, a voltage between the second power supply terminal and the first virtual terminal is less than a voltage between the second power supply terminal and the second virtual terminal, and when the second voltage regulator is enabled, a voltage between the second power supply terminal and the second virtual terminal is less than a voltage between the second power supply terminal and the first power supply terminal. When the first voltage regulator is disabled, a voltage between the second power supply terminal and the first virtual terminal may be substantially the same as a voltage between the second power supply terminal and the second virtual terminal, and when the second voltage regulator is disabled, a voltage between the second power supply terminal and the second virtual terminal may be substantially the same as a voltage between the second power supply terminal and the first power supply terminal. The first power supply voltage terminal may be a ground reference terminal. The circuitry may comprise a memory, and wherein, during a low power mode, only one of the first voltage regulator and the second voltage regulator may be enabled to prevent loss of state of the memory. The circuitry may comprise a functional block which performs a processor operation, and wherein, during a low power mode, one or more of the first voltage regulator and the second voltage regulator is enabled. Wherein during a deep low power mode, both the first voltage regulator and the second voltage regulator may be enabled. Upon exiting the deep low power mode, the second voltage regulator may be disabled prior to disabling the first voltage regulator.

In yet another aspect, there is provided, a processor comprising: a first virtual power supply terminal; a second virtual power supply terminal; a third virtual power supply terminal; a first power supply terminal; a second power supply terminal; functional circuitry which performs a processor operation coupled between the second power supply terminal and the first virtual power supply terminal; a first voltage regulator coupled between the first virtual power supply terminal and the second virtual power supply terminal; a memory coupled between the second power supply terminal and the third virtual power supply terminal; a second voltage regulator coupled between the third virtual power supply terminal and the second virtual power supply terminal; and a third voltage regulator coupled between the second virtual power supply terminal and the first power supply terminal, wherein: when the first voltage regulator is enabled, a voltage between the second power supply terminal and the first virtual power supply terminal is less than a voltage between the second power supply terminal and the second virtual power supply terminal, when the second voltage regulator is enabled, a voltage between the second power supply terminal and the third virtual power supply terminal is less than a voltage between the second power supply terminal and the second virtual power supply terminal, and when the third voltage regulator is enabled, a voltage between the second power supply terminal and the second virtual power supply terminal is less than a voltage between the second power supply terminal and the first power supply terminal. When the first voltage regulator is disabled, the first virtual power supply terminal may be directly connected to the second virtual power supply terminal, when the second voltage regulator is disabled, the third virtual power supply terminal may be directly connected to the second virtual power supply terminal, and when the third voltage regulator is disabled, the second virtual power supply terminal may be directly connected to the second power supply terminal. During a low power mode, only one of the second voltage regulator and the third voltage regulator may be enabled to prevent loss of state of the memory. During a deep low power mode, both the first voltage regulator and the second voltage regulator may be enabled. Upon exiting the deep low power mode, the third voltage regulator may be disabled prior to disabling the second voltage regulator.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
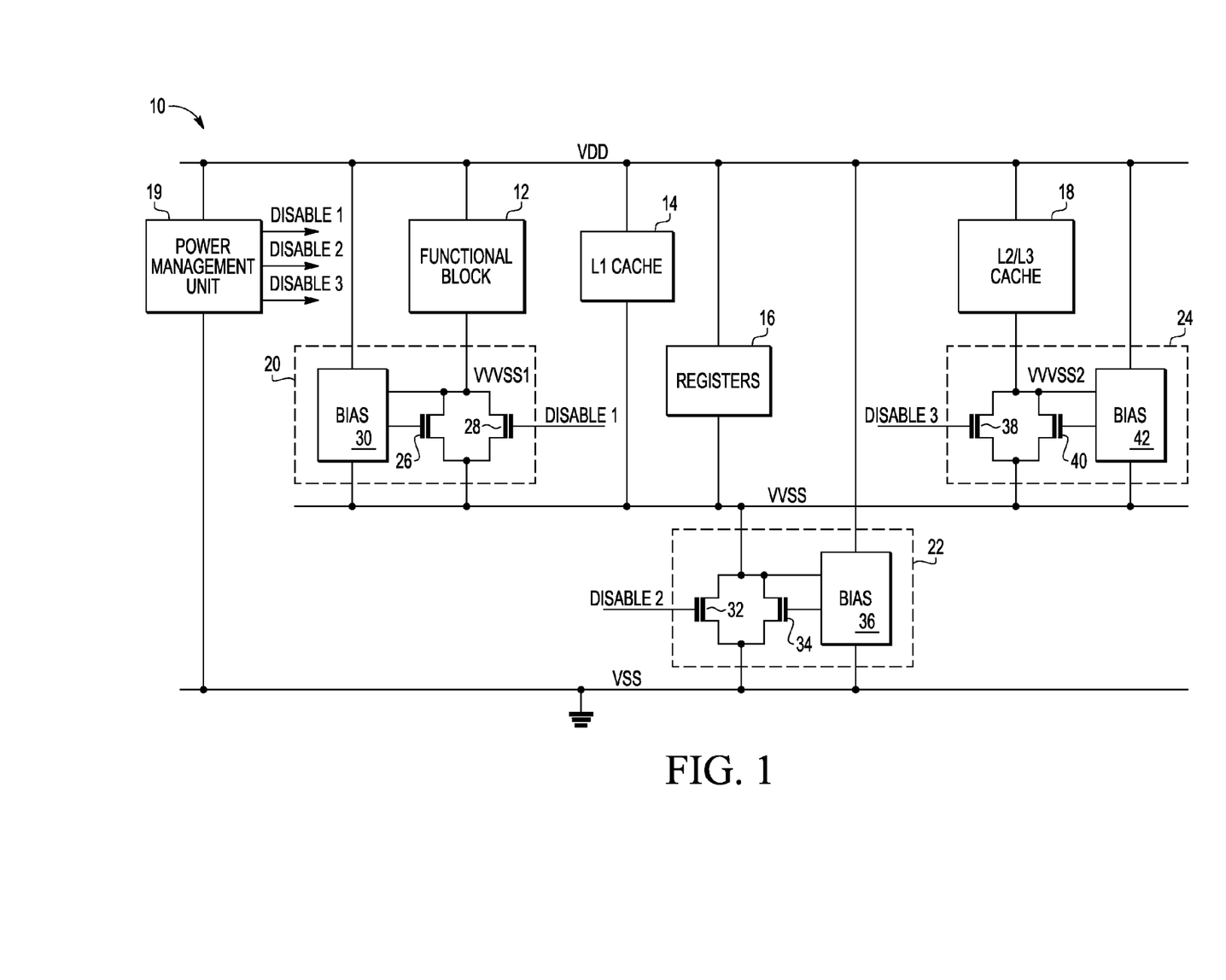
FIG. 1 illustrates, in partial block diagram form and partial schematic diagram form, a data processor in accordance with an embodiment.

FIG. 1 illustrates, in partial block diagram form and partial schematic diagram form, a simplified view of a data processor 10 in accordance with an embodiment. Data processor 10 can be any type of processor, such as for example, a microcontroller, a microprocessor core, or a digital signal processor (DSP). Data processor 10 includes a plurality of circuit blocks such as functional block 12, level 1 (L1) cache memory 14, registers 16, level 2 (L2) and/or level 3 (L3) cache memory 18, and power management unit 19. To simply the block diagram of data processor 10, interconnections between the circuit blocks have been left out. Also, other embodiments of data processor 10 may have more, fewer, or different blocks. Also, there may be more than one processor 10 in other embodiments. Processor 10 includes global voltage regulator 22 and local voltage regulators 20 and 24. Global voltage regulator 22 includes transistors 32 and 34, and bias circuit 36. Local voltage regulator 20 includes transistors 26 and 28 and bias circuit 30. Local voltage regulator 24 includes transistors 38 and 40 and bias circuit 42. An embodiment of a bias circuit is described later in the discussion of FIG. 2. In global voltage regulator 22, transistor 32 has a first current electrode coupled to a virtual ground conductor labeled "VVSS", a control electrode coupled to receive control signal "DISABLE 2", and a second current electrode coupled to a ground conductor labeled "VSS". Transistor 34 has a first current electrode coupled to VVSS, a control electrode, and a second current electrode coupled to VSS. Bias circuit 36 has a power supply terminal coupled to a power supply voltage terminal labeled "VDD", a power supply terminal coupled to VSS, an input terminal for receiving a feedback signal at the first current electrode of transistor 34, and an output coupled to the control electrode of transistor 34. In the illustrated embodiment, transistors 26, 28, 32, 34, 38, and 40 are N-channel transistors. In other embodiments, transistors 26, 28, 32, 34, 38, and 40 may be a different type of transistor.

In voltage regulator 20, transistor 26 has a first current electrode coupled to functional block 12 at a virtual power supply terminal labeled "VVVSS 1", a control electrode, and a second current electrode coupled to VVSS. Transistor 28 has a first current electrode coupled to function block 12 at virtual power supply terminal VVVSS 1, a control electrode coupled to receive a control signal labeled "DISABLE 1" from power management unit 19, and a second current electrode coupled to VVSS. Bias circuit 30 has a power supply terminal coupled to VDD, a power supply terminal coupled to VVSS, an input coupled to receive a feedback signal from VVVSS 1, and an output coupled to the control electrode of transistor 26. Note that the word "virtual" is used herein to indicate that the power supply voltage provided to a virtual power supply voltage terminal is not fixed, but is changed depending on the operating mode.

In voltage regulator 24, transistor 38 has a first current electrode coupled to cache memory 18 at power supply terminal VVVSS2, a control electrode for receiving control signal DISABLE 3 from power management unit 19, and a second current electrode coupled to VVSS. Transistor 40 has a first current electrode coupled to cache memory 18, a control electrode, and a second current electrode connected to VVSS. Bias circuit 42 has a power supply terminal connected to VDD, a power supply terminal connected to VVSS, an input connected to receive a feedback signal from VVVSS 2, and an output connected to the control electrode of transistor 40.

Each circuit block of processor 10 is coupled to power supply voltage terminal VDD. Power management unit 19 is also connected to power supply voltage terminal VSS. L1 cache 14 and registers 16 are also connected to virtual power supply voltage terminal VVSS. Functional block 12 is connected to power supply terminal VVVSS 1 and cache 18 is connected to power supply terminal VVVSS 2. Power is distributed to the various circuits of processor 10 depending on which circuits are operating. Also, power is distributed depending on whether it is necessary for the stored data to be retained when data processor 10 is in a low power state. In one embodiment, VSS is connected to ground; VVSS is connected to either ground potential or a first predetermined voltage above ground. Power supply terminal VVVSS 1 is either connected to ground potential, the first predetermined voltage above ground, or a second predetermined voltage above ground. Power supply terminal VVVSS 2 is either connected to ground potential, the first predetermined voltage above ground or a third predetermined voltage above ground, where the third predetermined voltage may be the same as, or different than, the second predetermined voltage.

Generally, control signals DISABLE 1, DISABLE 2, and DISABLE 3 are used to elevate the voltage at the ground terminals of the circuit blocks for the purpose of reducing power consumption by reducing static leakage current. Generally, the voltage regulators are tiered, or in a hierarchical order. All of the blocks of processor 10 can receive the same ground (VSS) potential, or some voltage level above ground, such as for example, the voltages at power supply terminals VVSS, or VVVSS 1 and VVVSS 2 depending on which voltage regulators are turned on. Volatile memory circuits, such as a SRAM (static random access memory) have certain voltage requirements for reliable data retention. In one embodiment, cache 18 is implemented as a SRAM and therefore has a minimum data retention voltage. Therefore, with respect to cache 18, care must be taken to ensure that the voltage at VVVSS 2 is not raised above the minimum data retention voltage.

During a normal mode, all of the circuit blocks receive the full power supply voltage. The power supply voltage terminals receive VDD and the ground terminals of all of the circuit blocks are coupled to ground (VSS). In the illustrated embodiment, the normal operating mode is entered when power management unit 19 asserts control signal DISABLE 1, DISABLE 2, and DISABLE 3 as logic high voltages. Each of transistors 26, 32, and 38 are conductive, effectively disabling voltage regulators 20, 22, and 24 so that power supply terminals VSS, VVSS, VVVSS 1, and VVVSS 2 are all at ground potential.

In one low power mode, control signal DISABLE 2 is negated and DISABLE 1 and DISABLE 3 are asserted. With DISABLE 2 negated, global voltage regulator 22 is enabled and used to elevate VVSS to the first predetermined voltage above ground. Local voltage regulators 20 and 24 are both turned off causing VVVSS 1 and VVVSS 2 to both be at the same potential as VVSS. When global voltage regulator 22 is enabled, control signal DISABLE 2 is negated as a logic low so that transistor 32 is substantially non-conductive. Transistor 34 is biased by bias circuit 36 so that the voltage level of VVSS is increased by the predetermined voltage level. To exit this low power mode and return to normal operation, control signal DISABLE 2 is asserted as a logic high voltage. Global voltage regulator 22 is disabled when control signal DISABLE 2 is asserted as a logic high voltage so that transistor 32 connects VSS to virtual VSS (VVSS). All of the circuits having their ground terminals coupled to VVSS will be coupled to ground potential.

In another low power mode, global voltage regulator 22 is off and any one or both of local voltage regulators 20 and 24 are turned on. If cache 18 has a minimum data retention voltage, and global voltage regulator 22 is to be turned on, then local voltage regulator 24 must first be turned off before global voltage regulator 22 is turned on to prevent exceeding the minimum data retention voltage. If functional block 12 does not have a data retention issue, then voltage regulators 22 and 20 can be turned on at the same time.

In a deep low power mode, all of the voltage regulators 20, 22, and 24 are turned on at the same time to reduce static leakage current by a maximum amount. However, it is possible that the minimum data retention voltage of cache 18 will not be maintained while processor 10 is in the deep low power mode. Note that the operating modes of data processor 10 are summarized in FIG. 4.

Figure 2:
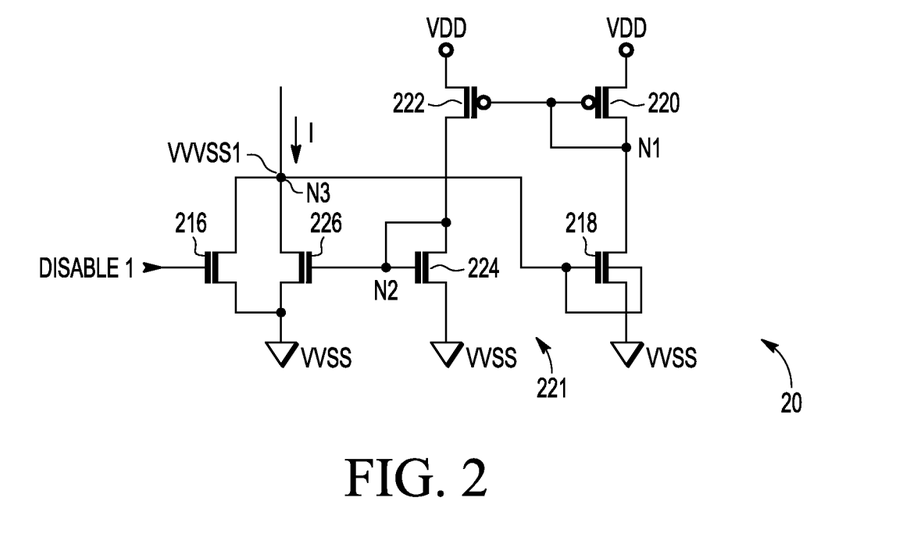
FIG. 2 illustrates, in schematic diagram form, a voltage regulator of the data processor of FIG. 1.

FIG. 2 illustrates, in schematic diagram form, voltage regulator 20 of data processor 10 in FIG. 1 in accordance with an embodiment. Voltage regulator 20 includes disable transistor 28, regulating transistor 26, and bias circuit 30. Bias circuit 30 includes sensing transistor 218, load transistor 220, and transistors 222 and 224. Transistors 222 and 224 are coupled together to form an inverting stage 221. Transistors 26, 28, 218, and 224 are N-type MOS (metal oxide semiconductor) transistors and transistors 220 and 222 are P-type MOS transistors implemented on an integrated circuit. In one embodiment, voltage regulator 20 is implemented using CMOS (complementary metal-oxide semiconductor) transistors on a silicon-on-insulator (SOI) substrate. In other embodiments, voltage regulator 20 can be implemented on another type of substrate using a different transistor type. In the illustrated embodiment, voltage regulators 22 and 24 are the same as voltage regulator 20. In another embodiment, voltage regulators 20, 22, and 24 may use a different type of voltage regulator circuit and may be different from each other.

Any type of circuit that would benefit from leakage reduction during low power mode can be coupled to internal node N3 (VVVSS 1). For example, the circuit can be one or more logic circuits or a plurality of memory cells, or a combination of logic and memory. In one embodiment, the circuit is an array of static random access memory (SRAM) cells such as cache 18. As illustrated in FIG. 1, functional block 12 can be any type of circuit. In one embodiment, function block 12 is combinational logic. A leakage current labeled "I" will be present when functional block 12 is in a low power mode. In one embodiment, VDD is a positive power supply voltage equal to about 0.9 volts and VVSS can be ground or a predetermined voltage above ground depending on whether or not voltage regulators 20 and 22 are turned on or off. Note that the particular voltage levels are not important for purposes of describing the embodiment. In another embodiment, VDD may be ground while VVSS is negative. Also, in other embodiments, the power supply voltage may be any voltage. During low power mode the voltage at the VVSS terminal is increased above ground to reduce the leakage current from the functional block 12.

Disable transistor 26 has a first current electrode connected to a node N3 (VVVSS1), a control electrode connected to receive disable signal DISABLE 1, and a second current electrode connected to power supply voltage terminal VVSS. Sensing transistor 218 has a first current electrode connected to a node N1, a control electrode and a body terminal both connected to node N3, and a second current electrode connected to VVSS. In other embodiments, the body terminal of transistor 218 may be connected to another node, such as for example, VVSS. Load transistor 220 has a first current electrode connected to a power supply voltage terminal VDD, a control electrode and a second current electrode both connected to the first current electrode of transistor 218 at node N1. P-channel transistor 222 has a first current electrode connected to VDD, a control electrode connected to the control electrode of transistor 220, and a second current electrode. Transistor 224 has a first current electrode connected to the second current electrode of transistor 222, a control electrode connected to the second current electrode of transistor 222, and a second current electrode connected to VVSS. Regulating transistor 26 has a first current electrode connected to the first current electrode of transistor 28, a control electrode connected to the control electrode of transistor 224 at node N2, and a second current electrode connected to VVSS. The body terminals (not shown) of N-channel transistors 26, 28, and 224 are connected to VVSS and the body terminals (not shown) of P-channel transistors 220 and 222 are connected to VDD.

During a normal mode of operation, circuit 12 (FIG. 1) is active and receives a normal operating power supply voltage at VDD. Disable signal DISABLE 1 is asserted as a logic high to make transistor 26 conductive, thus connecting node N3 to VVSS so that node N3 is at substantially VSS. Transistor 218 is substantially non-conductive as node N3 is at substantially VSS potential. Node N1 is at VDD potential so that transistors 220 and 222 are substantially non-conductive. Node N2 is at VSS potential so transistors 224 and 226 are substantially non-conductive. Because transistors 218, 220, 222, and 224 of bias circuit 30 are non-conductive, their currents are reduced to leakage levels.

During a low power mode, disable signal DISABLE 1 is negated as a logic low voltage causing transistor 28 to be substantially non-conductive. Leakage current labeled "I" in FIG. 2 will cause the voltage at node N3 to increase. Transistors 220, 222, and 224 provide a feedback path from node N1 to node N2. Generally, the gate of sensing transistor 218 is coupled to sense the voltage at node N3. When transistor 218 responds to the increasing voltage, the feedback path controls the voltage at the control electrode of regulating transistor 26 to maintain the voltage at node N3 at a predetermined voltage level. The body terminal of transistor 218 is connected to node N3 so that an increasing voltage at node N3 lowered the threshold voltage (VT) of transistor 218. Lowering the VT is this manner improves the conductivity of the transistor 218 without increasing the size of transistor 218. In one embodiment with a power supply voltage of 0.9 volts, the predetermined voltage level is about 300 millivolts (mV) above VSS, where VSS is at ground potential in the illustrated embodiment. In another embodiment, the predetermined voltage level is different. More specifically, during low power mode, the increasing voltage at node N3 will cause transistor 218 to start to become conductive, decreasing the voltage at node N1. The decreasing voltage at node N1 will bias transistors 220 and 222 to start to become conductive. When transistor 222 becomes conductive, the voltage at node N2 will increase. The increasing voltage at node N2 will cause transistor 26 to be conductive and reduce the voltage at node N3. Thus, regulating transistor 26 will maintain the voltage at node N3 the predetermined voltage level above VSS.

Because the power supply voltage is already very low (e.g. 0.9 volts), and due to variations in the process and the electrical characteristics of the transistors and the power supply voltage, the data state of circuit 12 may become easily corruptible, or unstable, when transitioning from a normal mode to a low power mode. In the case where circuit 12 is an SRAM array, increasing the voltage at node N3 too much can reduce margins to the point where memory cells inadvertently change logic states. Therefore, it is important that the voltage at node N3 transition smoothly and without any overshoot of the predetermined voltage above ground. In voltage regulator 20, transistors 222 and 224 form a very low gain inverting stage so that the voltage transitions at node N3 are over-dampened. This functions to maintain adequate margins in the memory cells that would otherwise be compromised if the voltage at node N3 had any overshoot. Adding margin to accommodate any overshoot at node N3 would reduce the predetermined voltage above ground that the virtual VSS could rise. This would increase the amount of leakage current. Therefore, it is desirable to have a circuit that consumes a small current to regulate the voltage at N3 while having an over-dampened response (no overshoot), while also having adequate gain to maintain the voltage at node N3 at the predetermined voltage level above VSS.

Figure 3:
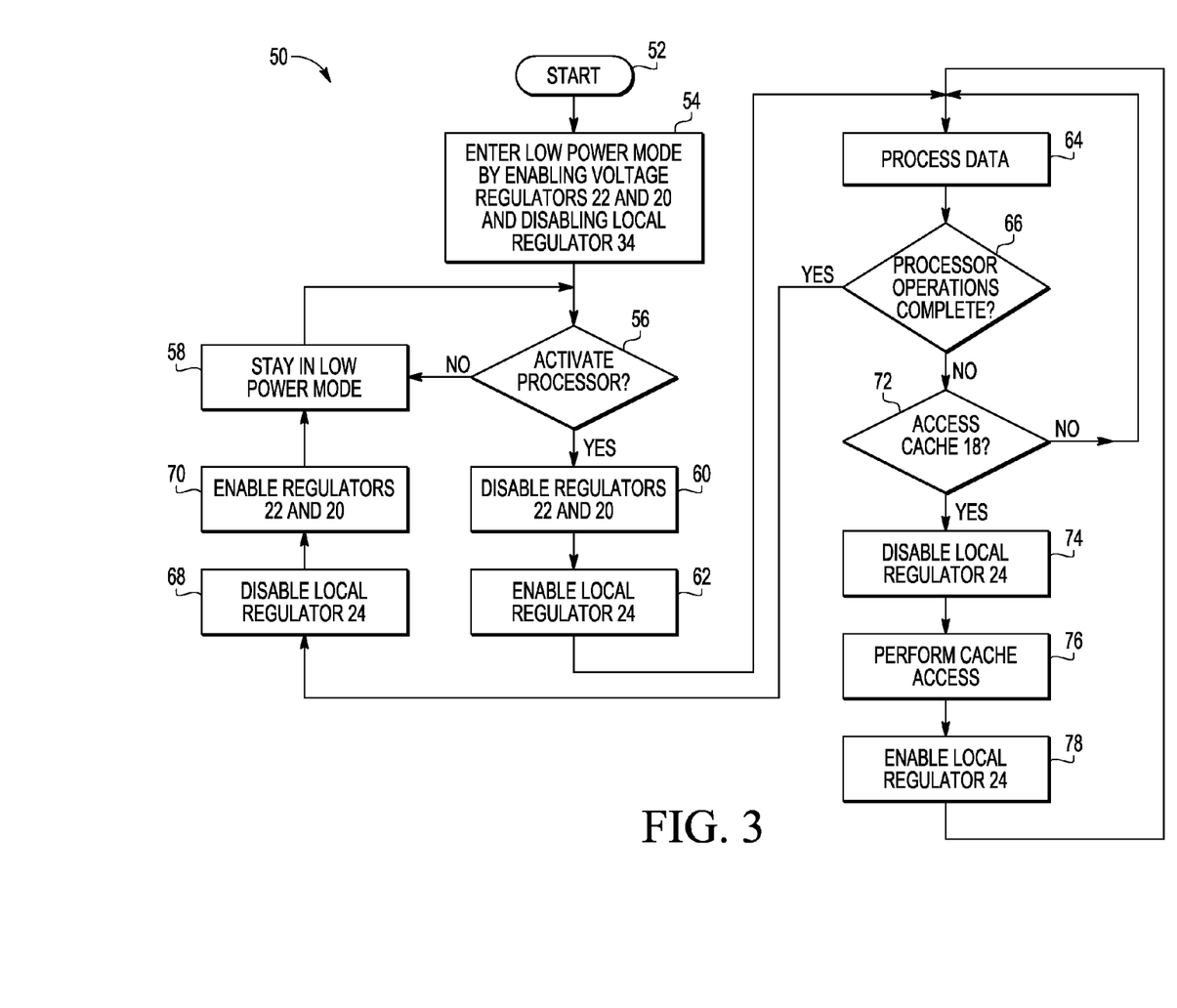
FIG. 3 illustrates a flow chart of a method for entering a low power mode of the data processor of FIG. 1

FIG. 3 illustrates a flow chart of a method 50 for entering a low power mode of data processor 10 of FIG. 1. Method 50 starts at step 52. At step 54, a low power mode is entered by enabling voltage regulators 22 and 20 and disabling voltage regulator 24. In other methods, a different low power mode may be entered depending on which voltage regulators are enabled. At decision step 56, it is determined if processor 10 is to be activated to, for example, execute instructions. If the answer is NO, the NO path is taken and step 56 is repeated. If it is determined that processor 10 should be activated, the YES path is taken to step 60. At step 60, regulators 22 and 20 are disabled by asserting control signals DISABLE 1 and DISABLE 2. When regulator 22 is disabled, VVSS is coupled to ground potential by transistor 32. Likewise, when regulator 20 is disabled, VVVSS 1 is coupled to VVSS by transistor 28 and VVVSS1 is also at ground potential. Functional block 12 and cache 18 are operating with a normal power supply voltage. At step 62, local regulator 24 is enabled to place cache 18 is low power mode. Regulator 22 was disabled prior to enabling regulator 24 to prevent VVVSS 2 from being elevated too far above ground to prevent the minimum data retention voltage from being exceeded. At step 64, functional block 12 processes data. In one embodiment, functional block 12 may be an execution unit and processes data by executing instructions. In another embodiment, functional block 12 may include combinational logic. At decision step 66, it is determined if processor 12 is finished processing data. If yes, then the YES path is taken to step 68. At step 68, voltage regulator 24 is first disabled so that the data of cache 18 is protected. At step 70, global regulator 22 and local regulator 20 are enabled. As discussed above, enabling regulator 22 causes the voltage at VVSS and VVVSS 1 to be elevated above ground by a first predetermined voltage level. Enabling local regulator 20 causes VVVSS 1 to be elevated by an additional amount to a second predetermined voltage level. In one embodiment where the power supply voltage VDD is 1.0 volts, the predetermined voltage is 0.2 volts above ground. Processor 10 is back in a low power mode when VVVSS 1 has been elevated. The loop between steps 58 and 56 is repeated until the processor is reactivated to process data. If at step 66, the NO path is taken to step 72, indicating that processor operations are not complete, and it is determined if cache 18 should be accessed. If the answer is NO, the NO path is taken back to step 64. If the answer is YES, the YES path is taken to step 74. The power supply voltage at cache 18 must be increased to the normal voltage before cache 18 can be reliably accessed during, for example, a read operation. At step 74, local regulator 24 is disabled by asserting control signal DISABLE 3. After step 76, the cache access is completed. At step 78, the low power mode is reentered by enabling voltage regulator 24.

Figure 4:
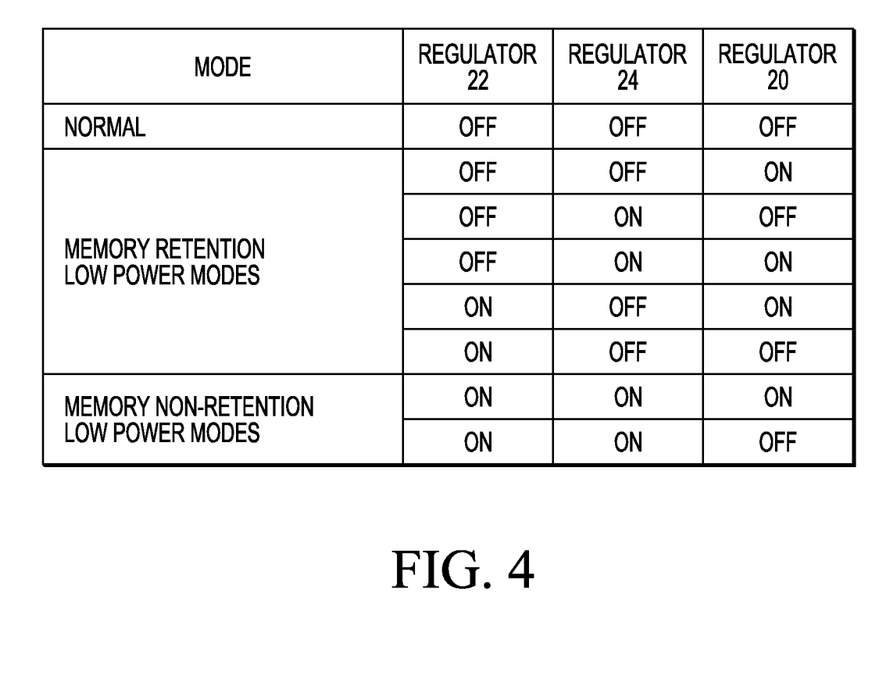
FIG. 4 illustrates a table of low power modes of the data processor of FIG. 1.

FIG. 4 illustrates a table of low power operating modes of data processor 10 of FIG. 1. In FIG. 4, the on and off states of regulators 20, 22, and 24 are illustrated for the various operating modes. As can be seen in FIG. 4, during a normal mode, all three regulators are off, and each circuit block is supplied with a full rail power supply voltage between VDD and VSS. In various low power modes, regulators 20, 22, and 24 can be on and off in various combinations. For example, in a data retention low power mode for cache memory 18, regulator 22 is on while regulator 24 is off. If both regulators 22 and 24 are on at the same time, then it is possible that the power supply voltage provided to cache 18 will be too low to reliably retain stored data. In another memory retention low power mode, regulator 22 can be off while regulator 24 is on. If it is not important that the stored data of cache 18 be retained, then a deeper non-retention low power mode can be entered be turning on both regulators 22 and 24 at the same time. The maximum static leakage current reduction can be had by turning all three voltage regulators on at the same time.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary data processor, this exemplary processor is presented merely to provide a useful reference in discussing various aspects of the invention. Of course, the description of the processor has been simplified for purposes of discussion, and it is just one of many different types of appropriate processors that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A processor comprising:
a first virtual ground terminal;
a second virtual ground terminal;
circuitry coupled to the first virtual ground terminal for providing current to the first virtual ground terminal;
a first regulating transistor coupled between the first virtual ground terminal and the second virtual ground terminal;
a first disabling transistor coupled in parallel with the first regulating transistor for selectively disabling the first regulating transistor by directly connecting the second virtual ground terminal to the first virtual ground terminal;
a second regulating transistor coupled between the second virtual ground terminal and a first ground terminal; and
a second disabling transistor coupled in parallel with the second regulating transistor for selectively disabling the second regulating transistor by directly connecting the second virtual ground terminal to the first ground terminal.

2. The processor of claim 1, further comprising:
a first bias circuit coupled between a power supply voltage terminal and the second virtual ground terminal and having an input coupled to the first virtual ground terminal and having an output coupled to a control electrode of the first regulating transistor; and
a second bias circuit coupled between the power supply voltage terminal and the first ground terminal and having an input coupled to the second virtual ground terminal and having an output coupled to a control electrode of the second regulating transistor.

3. The processor of claim 1, wherein the current provided by the circuitry to the first node is a leakage current which occurs during a lower power mode.

4. The processor of claim 1, wherein the circuitry is coupled to a power supply voltage terminal, wherein a voltage at the first virtual ground terminal is less than a voltage at the power supply voltage terminal and greater than ground.

5. The processor of claim 4, wherein a voltage at the first virtual ground terminal is less than a voltage at the power supply voltage terminal and greater than the voltage at the second virtual ground terminal.

6. The processor of claim 1, wherein the circuitry comprises a memory, and wherein only one of the first regulating transistor and the second regulating transistor is enabled during a lower power mode such that loss of state in the memory is prevented.

7. The processor of claim 1, wherein the circuitry comprises a functional block which performs a processor operation, and wherein one or more of the first regulating transistor and the second regulating transistor is enabled during a low power mode.

8. The processor of claim 7, wherein, upon exiting the low power mode, the second regulating transistor is disabled prior to disabling the first regulating transistor.

9. A processor comprising:
a first virtual terminal;
a second virtual terminal;
a first power supply terminal;
a second power supply terminal;
circuitry coupled between the second power supply terminal and the first virtual terminal;
a first voltage regulator coupled between the first virtual terminal and the second virtual terminal;
a second voltage regulator coupled between the second virtual terminal and the first power supply terminal, wherein:
when the first voltage regulator is enabled, a voltage between the second power supply terminal and the first virtual terminal is less than a voltage between the second power supply terminal and the second virtual terminal, and
when the second voltage regulator is enabled, a voltage between the second power supply terminal and the second virtual terminal is less than a voltage between the second power supply terminal and the first power supply terminal.

10. The processor of claim 9, wherein:
when the first voltage regulator is disabled, a voltage between the second power supply terminal and the first virtual terminal is substantially the same as a voltage between the second power supply terminal and the second virtual terminal, and
when the second voltage regulator is disabled, a voltage between the second power supply terminal and the second virtual terminal is substantially the same as a voltage between the second power supply terminal and the first power supply terminal.

11. The processor of claim 9, wherein the first power supply voltage terminal is a ground reference terminal.

12. The processor of claim 9, wherein the circuitry comprises a memory, and wherein, during a low power mode, only one of the first voltage regulator and the second voltage regulator is enabled to prevent loss of state of the memory.

13. The processor of claim 9, wherein the circuitry comprises a functional block which performs a processor operation, and wherein, during a low power mode, one or more of the first voltage regulator and the second voltage regulator is enabled.

14. The processor of claim 13, wherein during a deep low power mode, both the first voltage regulator and the second voltage regulator are enabled.

15. The processor of claim 14, wherein, upon exiting the deep low power mode, the second voltage regulator is disabled prior to disabling the first voltage regulator.

16. A processor comprising:
a first virtual power supply terminal;
a second virtual power supply terminal;
a third virtual power supply terminal;
a first power supply terminal;
a second power supply terminal;
functional circuitry which performs a processor operation coupled between the second power supply terminal and the first virtual power supply terminal;
a first voltage regulator coupled between the first virtual power supply terminal and the second virtual power supply terminal;
a memory coupled between the second power supply terminal and the third virtual power supply terminal;
a second voltage regulator coupled between the third virtual power supply terminal and the second virtual power supply terminal; and
a third voltage regulator coupled between the second virtual power supply terminal and the first power supply terminal, wherein:
when the first voltage regulator is enabled, a voltage between the second power supply terminal and the first virtual power supply terminal is less than a voltage between the second power supply terminal and the second virtual power supply terminal,
when the second voltage regulator is enabled, a voltage between the second power supply terminal and the third virtual power supply terminal is less than a voltage between the second power supply terminal and the second virtual power supply terminal, and
when the third voltage regulator is enabled, a voltage between the second power supply terminal and the second virtual power supply terminal is less than a voltage between the second power supply terminal and the first power supply terminal.

17. The processor of claim 16, wherein:
when the first voltage regulator is disabled, the first virtual power supply terminal is directly connected to the second virtual power supply terminal,
when the second voltage regulator is disabled, the third virtual power supply terminal is directly connected to the second virtual power supply terminal, and
when the third voltage regulator is disabled, the second virtual power supply terminal is directly connected to the second power supply terminal.

18. The processor of claim 17, wherein, during a low power mode, only one of the second voltage regulator and the third voltage regulator is enabled to prevent loss of state of the memory.

19. The processor of claim 17, wherein, during a deep low power mode, both the first voltage regulator and the second voltage regulator are enabled.

20. The processor of claim 19, wherein, upon exiting the deep low power mode, the third voltage regulator is disabled prior to disabling the second voltage regulator.

* * * * *